United States Patent
Hsu et al.

(10) Patent No.: US 7,332,937 B2
(45) Date of Patent: Feb. 19, 2008

(54) DYNAMIC LOGIC WITH ADAPTIVE KEEPER

(75) Inventors: Steven K. Hsu, Lake Oswego, OR (US); Atul Maheshwari, Portland, OR (US); Ram K. Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/321,328

(22) Filed: Dec. 28, 2005

(65) Prior Publication Data

US 2007/0146013 A1 Jun. 28, 2007

(51) Int. Cl.
*H03K 19/096* (2006.01)

(52) U.S. Cl. .................. 326/95; 326/31; 365/203

(58) Field of Classification Search ............ 326/95–98, 326/121, 31; 365/189.05, 230.08, 203
See application file for complete search history.

(56) References Cited

U.S. PATENT DOCUMENTS

| | | | |
|---|---|---|---|
| 6,366,132 B1 | 4/2002 | Karnik et al. | |
| 6,510,092 B1 | 1/2003 | Mathew et al. | |
| 6,549,040 B1 | 4/2003 | Alvandpour et al. | |
| 6,643,199 B1 | 11/2003 | Tang et al. | |
| 6,690,604 B2 | 2/2004 | Hsu et al. | |
| 6,791,364 B2 | 9/2004 | Alvandpour et al. | |
| 6,844,750 B2 | 1/2005 | Hsu et al. | |
| 6,914,452 B2 * | 7/2005 | Gauthier et al. | 326/98 |
| 7,002,375 B2 | 2/2006 | Hsu et al. | |
| 7,053,663 B2 | 5/2006 | Hazucha et al. | |
| 2004/0189347 A1 | 9/2004 | Hsu et al. | |
| 2004/0263192 A1 | 12/2004 | Persun et al. | |
| 2005/0104612 A1 | 5/2005 | Hsu et al. | |

* cited by examiner

*Primary Examiner*—Daniel Chang

(57) ABSTRACT

Disclosed herein are solutions for providing adaptive keeper functionality to dynamic logic circuits. In some embodiments, a programmable keeper circuit is coupled to a register file circuit. Included is a leakage indicator circuit to model leakage in at least a portion of the register file. A control circuit is coupled to the leakage indicator circuit and to the programmable keeper circuit to control the keeper strength in accordance with the modeled leakage. Other embodiments are claimed or otherwise disclosed.

17 Claims, 4 Drawing Sheets

DYNAMIC LOGIC WITH ADAPTIVE KEEPER

BACKGROUND

Leakage power dissipation is an important issue in the design of large scale integrated circuits such as microprocessors. Increased leakage, e.g., as a result of decreasing transistor dimensions, has resulted in the need for increased keeper sizes in dynamic circuits. Unfortunately, increased keeper sizes are not necessarily needed for all chips at all times in the same manner and can have undesirable results such as higher contention, higher power consumption, higher cross-over (short-circuit) current, and diminished performance. Accordingly, an improved keeper solution is desired.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Disclosed is an adaptive approach to provide keeper functionality with variable keeper strength. It operates to dynamically compensate for changes in leakage due to changing conditions, for example, resulting from variations in process, voltage, and/or temperature ("PVT").

Figure 1:
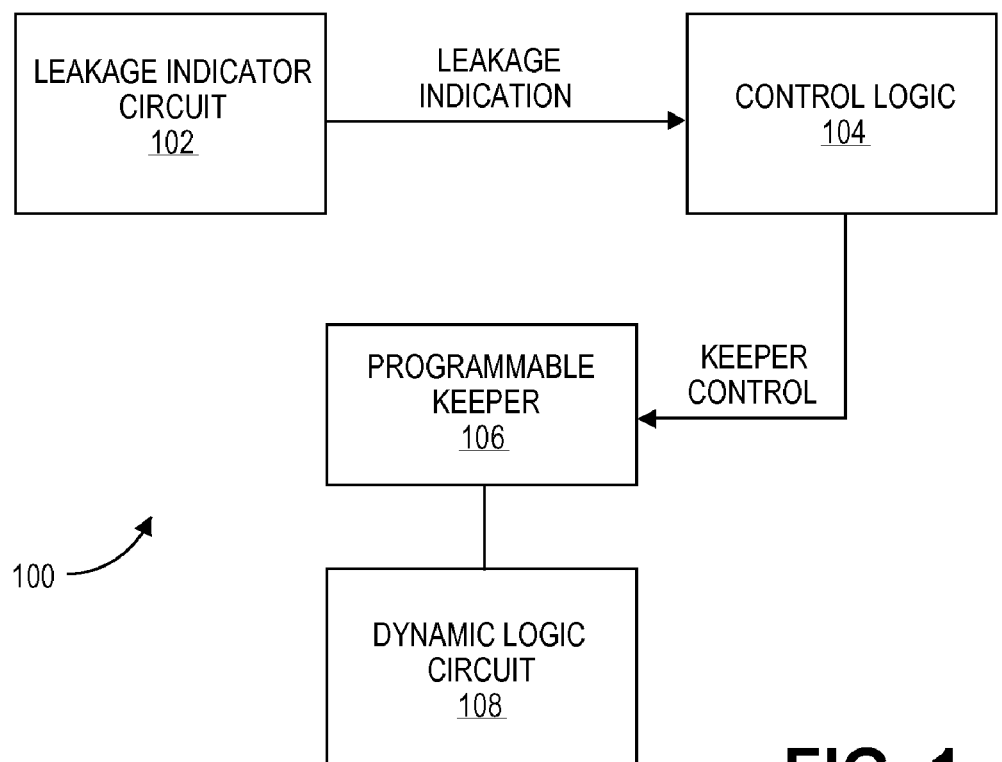
FIG. 1 is a block diagram of an adaptive keeper circuit according to some embodiments.

FIG. 1 shows a block diagram of an adaptive keeper sizing circuit 100 according to some embodiments. It generally comprises a leakage indicator circuit 102, a control logic circuit 104, a programmable keeper circuit 106, and a dynamic logic circuit 108. The dynamic logic circuit can be any dynamic logic circuit, circuits, or circuit portion that uses a keeper (or keepers), e.g., to offset the effects of pull-down stack leakage.

The programmable keeper circuit 106 is coupled to the dynamic logic circuit 108 to provide keeper functionality for the dynamic logic circuit 108. The strength of the programmable keeper 106 is controllably variable (or programmable). Any suitable keeper circuit configuration for providing controllably variable strength may be used. For example, the programmable keeper circuit 106 could comprise multiple keeper transistors that can be individually activated/de-activated in response to a control signal. Alternatively, it could comprise one or more transistors whose strengths are controllable via an analog gate or body bias signal. Any suitable scheme is encompassed so long as the keeper strength is controllable through an analog and/or digital control signal.

The leakage indicator circuit 102 comprises circuitry to suitably model leakage in a relevant part of the dynamic logic circuit 108. Accordingly, it may be located physically proximal to the dynamic logic circuit 108 and have components that suitably replicate (or model) leakage characteristics of at least some of the leaky aspects of the dynamic logic circuit 108. It generates a leakage indication signal, coupled to the control logic 104, indicating (either directly or indirectly) leakage occurring in the relevant part(s) of the dynamic circuit 108.

The control logic 104 converts the leakage indication signal into a keeper control signal to control the strength of the programmable keeper circuit 106. It may comprise any suitable combination of analog and/or digital circuitry to perform this function. The control logic 104 controls the programmable keeper circuit 106 in accordance with the leakage monitored from the leakage indication signal, e.g., to increase keeper strength when leakage increases and decrease keeper strength when leakage is lower. In the following sections, specific implementations are disclosed.

Figure 2:
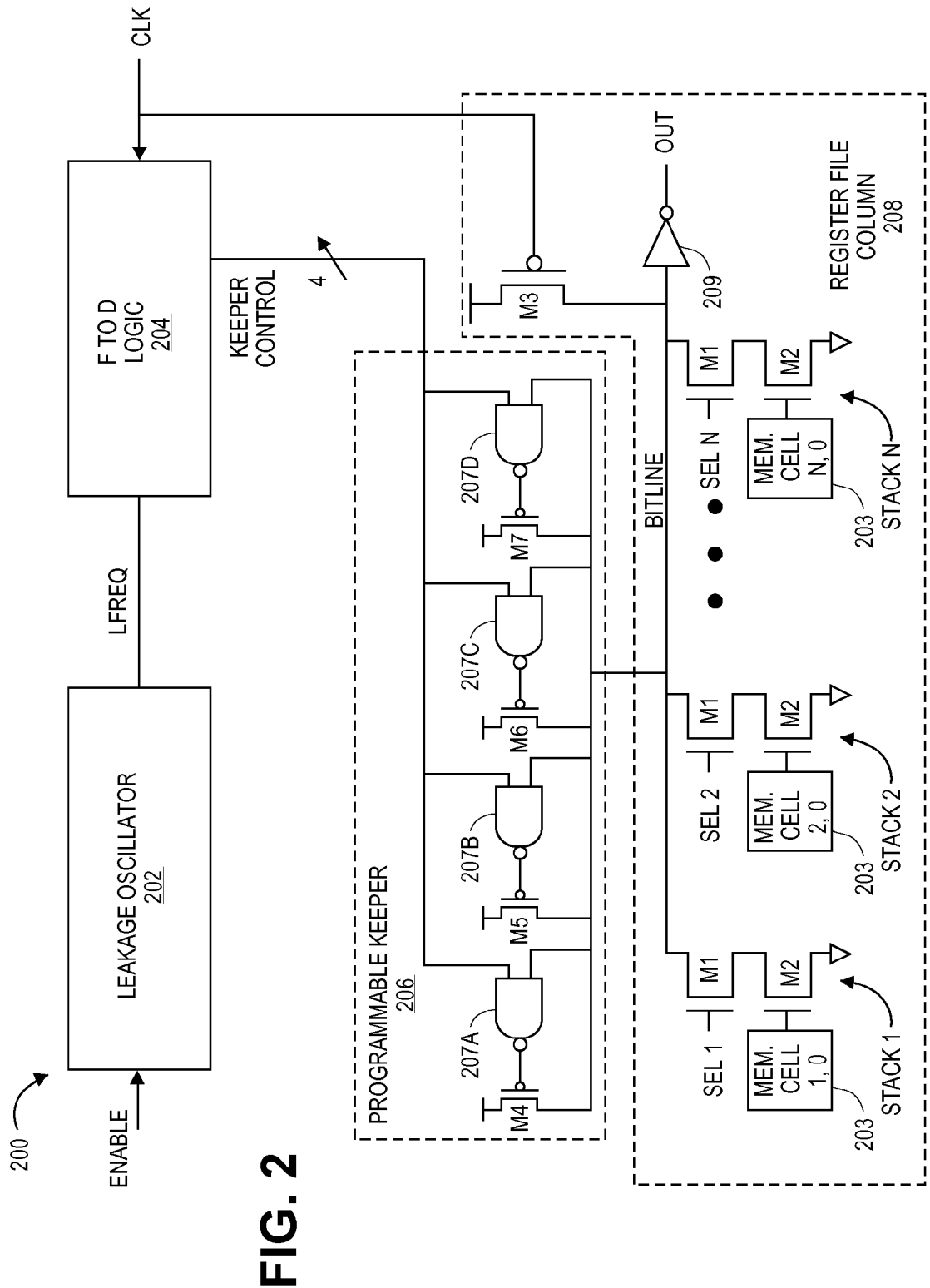
FIG. 2 is a block diagram of a register file circuit with an adaptive keeper according to some embodiments.

FIG. 2 shows a portion of a register file circuit 200 with a programmable keeper circuit whose strength is dynamically adjustable for changes in leakage. In the depicted embodiment, the programmable keeper is used in a register file circuit, but it may be used in any dynamic (or other) circuit where keeper circuits are used.

Circuit 200 generally comprises a leakage oscillator 202, frequency-to-digital (F-to-D) logic 204, and a programmable keeper circuit 206 operably coupled to a register file column 208. The leakage oscillator 202 is coupled to the F-to-D logic 204 to provide it with a frequency signal (LFREQ) whose value corresponds to a relative amount of leakage in the register file column 208. The F-to-D logic 204 is coupled to the programmable keeper circuit 206 to control its strength based on the relative leakage as determined from the frequency signal. An enable (ENABLE) signal is provided at the leakage oscillator 202 to enable it, and a clock (CLK) signal (e.g., a microprocessor core clock) is coupled to the F-to-D logic 204 and register file column 208.

The leakage oscillator 202 comprises an oscillator whose frequency is indicative (e.g., proportional) to relevant leakage current in the register file column 208. Any suitable circuit could be used for this purpose. With the depicted register file circuit 208, relevant leakage occurs in NMOS pull-down stacks that are coupled to a bit line node of the register file column 208. Thus, as implemented in the leakage oscillator of FIG. 3 (discussed below), it may comprise a ring oscillator circuit with leakage inverter stages having NMOS pull-down devices that suitably model the NMOS stacks in the register file column 208.

The F-to-D logic 204 may be implemented with any suitable logic (hardware and/or software) to convert the frequency signal (LFREQ) from the leakage oscillator to a suitably stable (e.g., latched) signal to control the strength of the programmable keeper circuit 206 based on relevant leakage as indicated by the leakage oscillator. In some embodiments, the F-to-D logic 204 comprises a counter with appropriate decoder and latch logic at its outputs to provide the keeper control signal. Depending upon the relative frequencies of the LFREQ and CLK signals, for example, the counter may be configured to count either the CLK or LFREQ signal pulses and reset upon receiving a pulse from the other e.g., (slower) signal.

For example, in some embodiments, the leakage oscillator 202 is designed to have an operating range of between 50 to 150 MHz over expected PVT with a nominal operating value of 100 MHz with the CLK frequency being at 4 GHz. The counter is configured to "count" off of the CLK signal and reset the count off of the LFREQ signal. Thus, as LFREQ increases in frequency (e.g., indicating increased leakage), the count decreases and vice versa. Appropriate logic at the counter output, such as inverters and/or divide-by logic, is implemented to make the KEEPER CONTROL signal proportional to the LFREQ frequency and normalized to a 4-bit digital output. The logic also includes latches clocked at a suitable rate to provide a sufficiently stable KEEPER CONTROL signal to the programmable keeper circuit 206.

The register file column 208 is a part of a register file with multiple register file columns (not all shown). The register file column 208 includes N memory cells 203, N pull-down stacks (Stack 1 to Stack N), a precharge (pull-up) transistor M3, and an output inverter 209. Each stack comprises NMOS transistors M1 and M2 coupled together in series between ground and a common bit line node (BITLINE). The precharge transistor M3 is coupled to the clock (CLK) and to the bit line node to charge it during a precharge clock phase (Low), and the output inverter 209 is coupled to the bit line node to provide an amplified, inverted output signal (OUT) during an evaluate clock phase (High).

Each memory cell 203 is coupled to the gate of the M2 transistor in its associated stack. The M1 transistor in each stack is coupled at its gate to an associated select signal (one of SEL 1 to SEL N) to select (when activated High)the data from its associated memory cell 203 to be coupled to the bit line node during the evaluate phase. During an evaluate phase, one of the N select signals is asserted (High) to turn on the M1 transistor and thereby couple the data stored at the gate of its associated M2 transistor to the bit line node. Unfortunately, even though the select signals to the other stacks are de-asserted (Low), leakage in the stacks undesirably pulls down the charged bit line node, which can adversely affect its operation. Accordingly, the programmable keeper circuit 206 is coupled to the bit line node to offset the leakage.

The depicted programmable keeper circuit 206 generally comprises keeper transistors M4 to M7 and NAND gates 207A to 207D coupled together as indicated. An input of each NAND gate is coupled to one of the bits from the 4-bit KEEPER CONTROL signal and collectively serve to decode the signal to activate an appropriate combination of keeper transistors (M4, M5, M6, and/or M7) to control the keeper circuit 206 to provide a keeper with an appropriate strength. The NAND outputs are each coupled to an associated keeper transistor, while their other input is coupled to the bit line node for appropriate keeper operation.

The amount of needed keeper strength is proportional to the amount of occurring leakage, which can vary from chip to chip and over time within a chip. Thus, based on the amount of leakage as determined from the LFREQ signal, the F-to-D logic 204, through the KEEPER CONTROL signal, activates an appropriate combination of the keeper transistors (M4 to M7). The keeper transistors (M4 to M7) may be of similar size or differently weighted such as binary weighted or otherwise to provide a larger number of keeper strength settings. Likewise, while the depicted embodiment utilizes four keeper transistors, any suitable number could be used.

Figure 3:
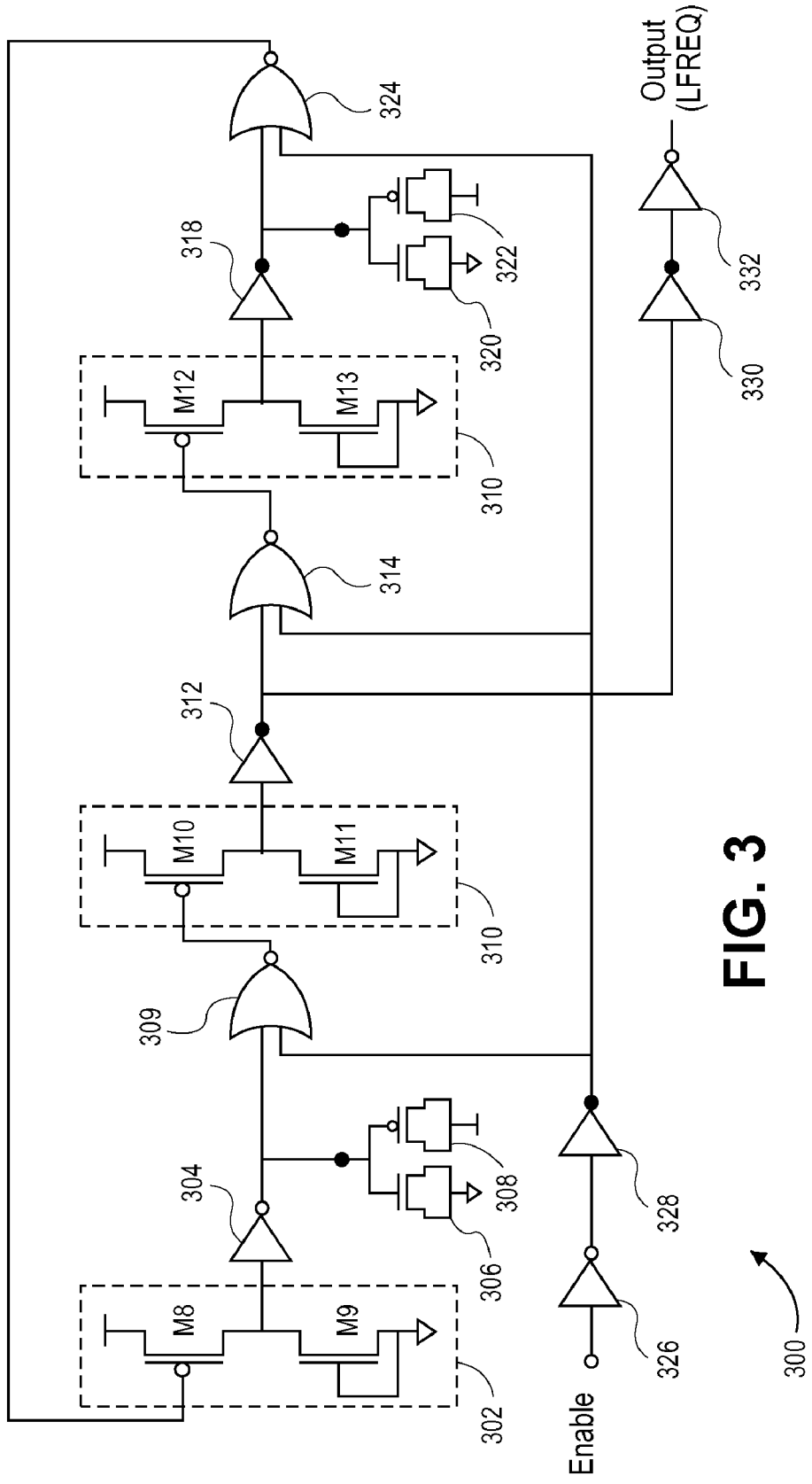
FIG. 3 is a schematic diagram of a leakage ring oscillator circuit to indicate relative leakage in accordance with some embodiments.

FIG. 3 shows a leakage oscillator 300 implementing a ring oscillator configuration according to some embodiments. The depicted leakage ring oscillator comprises nine cascaded inverter stages implemented with leakage inverters 302, 310, 316; inverter stages 304, 312, 318; and NOR gates 309, 314, 324 (acting as inverters when the circuit is enabled). The circuit also includes capacitive MOS load pairs 306/308, 320/322; input enable inverters 326, 328; and output driver inverters 330, 332.

Leakage inverter 302 comprises pull-up PMOS transistor M8 and pull-down NMOS transistor M9 with its gate tied to its source. Similarly, leakage inverter 310 comprises pull-up transistor M10 and pull-down transistor M11, while leakage inverter 316 comprises pull-up transistor M12 and pull-down transistor M13. The pull-down transistors have their gates tied to their sources to replicate the turned off NMOS stacks in the modeled register file column. Thus, the leakage inverters (302, 310, 316) not only provide an inverter function for the ring oscillator, but also, they have a delay in one signal transition direction (pull-down) that is dominated by leakage. Thus, aside from node capacitance, this leakage (and in particular, its effect on the delay of the 1-to-0 transition of the leakage inverter) primarily dictates the frequency of the oscillator. As leakage increases, thereby reducing the pull-down delay in the leakage inverters, the oscillator frequency increases and vice versa.

The three leakage inverters (302, 310, 316) have substantially negligible pull-up delays, but relatively long pull-down delays determined by their n-type transistors, each of which has its gate shorted to ground for this embodiment. It will be appreciated that, for other embodiments, the gates of one or more of the leakage inverters may be coupled to receive a different voltage that provides a gate-to-source voltage $V_{gs}$ less than the threshold voltage for the respective leakage device. Further, for other embodiments, a different number of leakage inverter stages may be used. For the exemplary embodiment described herein, however, using more than three leakage inverter stages may make the frequency of the output signal from the leakage ring oscillator inconveniently small and may not appreciably improve the accuracy of the leakage measurement. Conversely, at least three leakage stages may be recommended for the following reasons. (Note that embodiments of the invention are not limited to ring oscillator implementations with three leakage inverter stages. Any number may be suitable depending on the operating environment and application requirements.)

If only one leakage stage is used, then the remaining even number of conventional inverters would typically need to have a zero-to-one transition time that is several (e.g. more than 5) times larger than the pull-up transition time of the p-type device in the single leakage inverter stage. In this manner, the worst within-die variation, which might cause this delay to be small, would still give the p-type device in the n-type leakage inverter enough time to charge the output node to Vcc. The problem, then, is that at high temperatures or for very short channel lengths, the pull-down leakage-based switching delay becomes much shorter due to increased leakage current.

If, instead, an even number (e.g., 2) of leakage stages are used, then there would be an odd number of conventional CMOS inverters in the oscillator. This arrangement would cause one of the leakage inverters to be driven by an odd number of stages, while the other leakage inverter is driven by an even number of stages. The result would be an asymmetric drive of the leakage inverter stages with dissimilar waveforms. Further, one of the leakage inverters would be subject to the same situation as described above in which the p-type transistor must be given enough time to reach the respective supply rail.

A leakage oscillator, such as the leakage oscillator of FIG. 3, that includes an odd number of at least three leakage inverter stages addresses the above issues to drive leakage stages symmetrically, and provide each of the leakage stages ample time for their output nodes to transition to the positive Vcc rail. In this manner, leakage measurements may be more accurate through a wider channel length range and/or through a wider temperature range, particularly when the temperature is high.

The capacitive MOS loads 306/308 and 320/322 are designed to be equal in size to the output inverter 330 and are coupled, respectively, to the outputs of inverters 304, 318 to provide symmetric loads on the three sections of the oscillator.

As shown in FIG. 3, the exemplary leakage ring oscillator includes two conventional CMOS inverting gates (inverter and NOR gate acting as inverter) between its leakage stages. For other embodiments, a different number of intermediate conventional CMOS inverting gates may be used. Two inverting gates between each of the leakage gates may be beneficial for some embodiments because such a configuration substantially reduces the likelihood (if not prevents) the delays of the conventional inverting stages from being comparable to those of the leakage stages at high temperature.

NOR gates 308, 314, 324 are used to provide for an enable signal ("Enable") for selectively enabling and disabling the oscillator. Each one of the leakage inverter stages is preceded by one of these enabling NOR gates. Using this approach, when the enable signal is de-asserted (High) to disable the leakage oscillator, the outputs of the leakage inverters are all strongly driven to Vcc (i.e. substantially fully turned on) instead of being held down weakly by the leakage n-type devices. In this manner, the output nodes of the leakage inverters are prevented from floating in case the design is faulty. Floating output nodes of the leakage inverters could drive standing currents in the subsequent inverters. Further, the ability to enable and disable the leakage ring oscillator when desired may be advantageous as compared to a free running oscillator in terms of power consumption. A free-running oscillator consumes power at all times, which may not be acceptable or desirable for many designs.

In operation, in response to the enable signal being asserted (Low), the leakage oscillator is enabled, and an oscillating output signal is provided at the output (LFREQ). The frequency of the oscillating output signal, as discussed above, is directly proportional to the source-to-drain channel leakage current of the n-type devices in the leakage inverters 302, 310, 316, which indicates the leakage current of the modeled register file.

Figure 4:
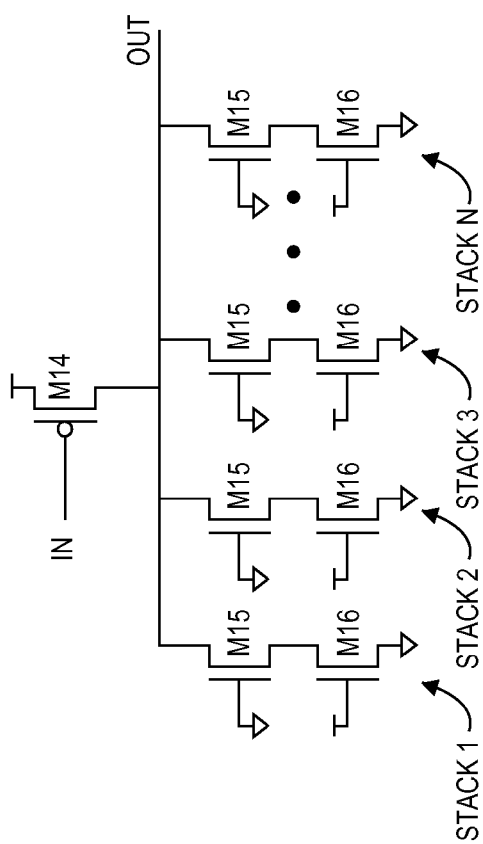
FIG. 4 is a schematic diagram of a leakage gate in accordance with some embodiments.

FIG. 4 shows an alternative embodiment of a leakage inverter suitable for use as a leakage inverter in a leakage oscillator circuit. The leakage inverter comprises a pull-up p-type transistor M14 coupled to N stacks of n-type pairs M15/M16 at an output node (OUT). Each stack more particularly models a stack in a register file column. As such, the M15 gates are coupled to ground, while the M16 gates are coupled to Vcc. In the depicted embodiment, N stacks (corresponding to the number of stacks in the modeled register file column) are used. However, any suitable number to appropriately model the leakage behavior of the register file could be used. Further, the individual transistors could be sized larger to use a smaller number of stacks if desired.

Figure 5:
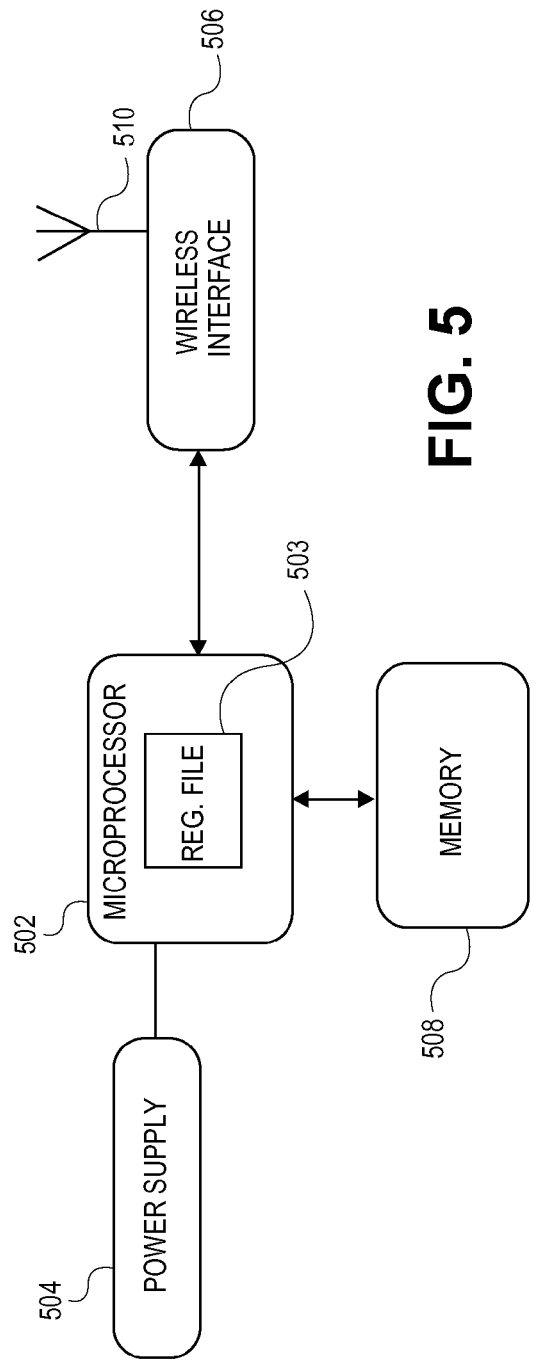
FIG. 5 is a block diagram of a computer system with at least one register file having an adaptive keeper in accordance with some embodiments.

With reference to FIG. 5, one example of a computer system is shown. The depicted system generally comprises a processor 502 that is coupled to a power supply 504, a wireless interface 506, and memory 508. It is coupled to the power supply 504 to receive from it power when in operation. The wireless interface 506 is coupled to an antenna 510 to communicatively link the processor through the wireless interface chip 506 to a wireless network (not shown). Microprocessor 502 comprises a register file 503 with an adaptive keeper circuit in accordance with embodiments discussed herein.

It should be noted that the depicted system could be implemented in different forms. That is, it could be implemented in a single chip module, a circuit board, or a chassis having multiple circuit boards. Similarly, it could constitute one or more complete computers or alternatively, it could constitute a component useful within a computing system.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

Moreover, it should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS. for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. A chip, comprising:
   a dynamic logic circuit;
   a programmable keeper circuit coupled to the dynamic logic circuit, the programmable keeper circuit having a controllably variable keeper strength;
   a leakage indicator circuit to model a leakage in the dynamic logic circuit, the leakage indicator circuit comprising a leakage oscillator circuit having a leakage gate circuit to model leakage in a portion of the dynamic logic circuit; and
   a control circuit coupled between the leakage indicator circuit and the programmable keeper circuit to control the keeper strength based on the modeled leakage.

2. The chip of claim 1, in which the dynamic logic circuit comprises a register file column.

3. The chip of claim 1, in which the programmable keeper circuit comprises a plurality of keeper transistors, wherein each transistor may be controllably engaged and disengaged.

4. The chip of claim 1, in which the leakage gate circuit comprises a leakage inverter.

5. The chip of claim 1, in which the leakage indicator circuit comprises a leakage ring oscillator circuit with one or more of the leakage gates functioning as inverter stages, the output frequency of the ring oscillator circuit being proportional to leakage in the one or more leakage gates.

6. The chip of claim 5, in which the control circuit comprises a counter to generate a keeper control signal from an output frequency of the leakage oscillator circuit.

7. A chip, comprising:
a programmable keeper circuit coupled to a register file circuit;
a leakage indicator circuit to model leakage in at least a portion of the register file, the leakage indicator circuit comprising a leakage oscillator circuit having a leakage gate circuit to model leakage in a portion of the register file circuit; and
a control circuit coupled to the leakage indicator circuit and to the programmable keeper circuit to control the keeper strength in accordance with the modeled leakage.

8. The chip of claim 7, in which the programmable keeper circuit comprises a plurality of keeper transistors, wherein each transistor may be controllably engaged and disengaged.

9. The chip of claim 7, in which the leakage gate circuit comprises a leakage inverter.

10. The chip of claim 7 in which the leakage indicator circuit comprises a leakage ring oscillator circuit with one or more of the leakage gates functioning as inverter stages, the output frequency of the ring oscillator circuit being proportional to leakage in the one or more leakage gates.

11. The chip of claim 10, in which the control circuit comprises a counter to generate a keeper control signal from an output frequency of the leakage oscillator circuit.

12. A system, comprising:
(a) a microprocessor comprising:
(i) a programmable keeper circuit coupled to a register file circuit,
(ii) a leakage indicator circuit to model leakage in at least a portion of the register file, the leakage indicator circuit comprising a leakage oscillator circuit having a leakage gate circuit to model leakage in a portion of the register file circuit; and
(iii) a control circuit coupled to the leakage indicator circuit and to the programmable keeper circuit to control the keeper strength in accordance with the modeled leakage;
(b) an antenna; and
(c) a wireless interface coupled to the microprocessor and to the antenna to communicatively link the microprocessor to a wireless network.

13. The chip of claim 12, in which the programmable keeper circuit comprises a plurality of keeper transistors, wherein each transistor may be controllably engaged and disengaged.

14. The chip of claim 12, in which the leakage gate circuit comprises a leakage inverter.

15. A circuit comprising:
a leakage indicator circuit to model leakage in at least a portion of a dynamic logic circuit, the leakage indicator circuit comprising a leakage oscillator circuit having a leakage gate circuit to model leakage in the portion of the dynamic logic circuit the leakage indicator circuit to control a programmable keeper circuit coupled to the dynamic logic circuit in accordance with the modeled leakage.

16. The circuit of claim 15, in which the leakage gate circuit comprises a leakage inverter.

17. The chip of claim 15, in which the leakage indicator circuit comprises a leakage ring oscillator circuit with one or more of the leakage gates functioning as inverter stages, the output frequency of the ring oscillator circuit being proportional to leakage in the one or more leakage gates.

* * * * *